United States Patent
Solomon et al.

(10) Patent No.: US 7,908,542 B2
(45) Date of Patent: Mar. 15, 2011

(54) METHOD OF AND APPARATUS FOR IMPLEMENTING A RECONFIGURABLE TRELLIS-TYPE DECODING

(75) Inventors: Doron Solomon, Holon (IL); Gilad Garon, Jerusalem (IL)

(73) Assignee: ASOCS Ltd (IL)

( * ) Notice: Subject to any disclaimer, the term of this patent is extended or adjusted under 35 U.S.C. 154(b) by 943 days.

(21) Appl. No.: 11/210,621

(22) Filed: Aug. 24, 2005

(65) Prior Publication Data

US 2006/0048037 A1  Mar. 2, 2006

Related U.S. Application Data

(60) Provisional application No. 60/604,258, filed on Aug. 25, 2004.

(51) Int. Cl.
*H03M 13/00* (2006.01)
(52) U.S. Cl. .......................... 714/774; 714/796
(58) Field of Classification Search .................. 714/774, 714/796
See application file for complete search history.

(56) References Cited

U.S. PATENT DOCUMENTS

| | | | | |
|---|---|---|---|---|
| 4,757,506 A * | 7/1988 | Heichler | ...... | 714/795 |
| 5,742,621 A * | 4/1998 | Amon et al. | ...... | 714/792 |
| 5,787,129 A * | 7/1998 | Willming | ...... | 375/346 |
| 5,828,675 A | 10/1998 | Chen et al. | ...... | 371/28 |
| 6,438,181 B1 * | 8/2002 | Setlur et al. | ...... | 375/341 |
| 6,615,388 B1 * | 9/2003 | Takamichi | ...... | 714/795 |
| 6,690,739 B1 * | 2/2004 | Mui | ...... | 375/265 |
| 6,734,920 B2 * | 5/2004 | Ghosh et al. | ...... | 348/614 |
| 6,738,941 B1 | 5/2004 | Todoroki | ...... | 714/755 |
| 6,865,710 B2 * | 3/2005 | Bickerstaff et al. | ...... | 714/796 |
| 7,127,664 B2 * | 10/2006 | Nicol et al. | ...... | 714/792 |
| 7,257,757 B2 * | 8/2007 | Chun et al. | ...... | 714/746 |
| 2001/0036232 A1 * | 11/2001 | Betts | ...... | 375/265 |
| 2002/0119803 A1 * | 8/2002 | Bitterlich et al. | ...... | 455/552 |
| 2002/0129317 A1 * | 9/2002 | Nicol et al. | ...... | 714/792 |
| 2002/0129320 A1 * | 9/2002 | Bickerstaff et al. | ...... | 714/796 |
| 2003/0123563 A1 * | 7/2003 | Lu | ...... | 375/265 |
| 2004/0255230 A1 * | 12/2004 | Chen et al. | ...... | 714/796 |

(Continued)

FOREIGN PATENT DOCUMENTS

WO   WO 02/21699   4/2002

OTHER PUBLICATIONS

Cavallaro et al., "Viturbo: A Reconfigurable Architectre for Viterbi and Turbo Decoding," IEEE, 2:497-500 (2003).

(Continued)

*Primary Examiner* — M. Mujtaba K Chaudry
(74) *Attorney, Agent, or Firm* — McDermott Will & Emery LLP (57) ABSTRACT

A chip architectural core is described for use in decoding one or more vectors received by the core in accordance with one or more recursive and/or non-recursive systematic trellis codes of varying sizes and constraints K, as well as generator polynomials. The core comprises: a decoder including (a) a reconfigurable network of ACS blocks, BMU generators and trace-back mechanisms for both recursive and non-recursive systematic forms, and (b) reconfigurable connections between the ACS blocks, BMU generators and trace-back mechanisms, arranged so that the precise number of network components can be continuously rearranged and interconnected in a network as a function of size and the constraint K and generator polynomial of each code used for encoding the vectors received by the core.

40 Claims, 11 Drawing Sheets

U.S. PATENT DOCUMENTS

2005/0034051 A1* 2/2005 Chun et al. .................... 714/795
2009/0031191 A1* 1/2009 Yang et al. .................... 714/758

OTHER PUBLICATIONS

Hocevar, D.E., et al., Achieving Flexibility in a Viterbi Decoder DSP coprocessor, Vehicular Technology Conference, 2000 IEEE VTS Fall VTC 2000, vol. 5, Sep. 24, 2000, pp. 2257-2264.

Abe, et al., "Space-Time Turbo Equalization and Symbol Detection in Frequency Selective MIMO Channels", VTC Fall 2001, IEEE 54th, Vehicular Technology Conference. vol. 1 of 4, conf. 54, Oct. 7, 2001, pp. 1230-1234.

Swaminathan, et al., "A Dynamically Reconfigurable Adaptive Viterbi Decoder", FPGA 2002, 10th ACM, Feb. 24, 2002, pp. 227-236.

Supplementary European Search Report from related EP Application No. 05788815.8, 18PP, 2008.

* cited by examiner

FIG. 1

(Prior Art)

FIG. 2

(Prior Art)

METHOD OF AND APPARATUS FOR IMPLEMENTING A RECONFIGURABLE TRELLIS-TYPE DECODING

RELATED APPLICATIONS

The present application claims priority from U.S. Provisional Applications, Ser. Nos.

60/604,258, filed Aug. 25, 2004 and entitled Method and Device for On-line Reconfigurable Viterbi Decoding of Recursive and Non-recursive Systematic Convolution Codes with Varying Parameters; and the following non-provisional U.S. application Ser. Nos.

U.S. Ser. No. 11/071,340, filed Mar. 3, 2005 and entitled Low-Power Reconfigurable Architecture For Simultaneous Implementation Of Distinct Communication Standards; and U.S. Ser. No. 11/176,149, filed Jul. 7, 2005 and entitled A Method of and Apparatus for Implementing Fast Orthogonal Transforms of Variable Size.

FIELD OF THE DISCLOSURE

The disclosure relates to a system for and method of implementing an on-line reconfigurable hardware decoder of a Viterbi decoding algorithm of different constraint lengths K, polynomial generators, and optionally for recursive and/or non-recursive systematic codes. The system and method are particularly useful in communication devices using such algorithms.

BACKGROUND OF THE DISCLOSURE

Binary transmission of data through a noisy channel has given rise to various approaches to minimize errors that can result from such transmission. For example, various forward error correction (FEC) techniques have been developed for encoding the signals prior to transmitting them through the channel, with compatible decoding techniques at the receiving end for reducing the overall error rate. One FEC technique to improve the capacity of a channel includes adding some carefully designed redundant information to the data being transmitted through the channel. The process of adding this redundant information is known as channel coding. Convolution and block coding are currently two major forms of channel coding. Convolution coding typically operates on serial data, one or a few bits at a time. Block codes operate on relatively large (typically, up to a couple of hundred bytes) message blocks. There are a variety of useful convolution and block codes, and a variety of algorithms for decoding the received coded information sequences to recover the original data. Convolution coding with compatible decoding is a FEC technique that is particularly suited to a channel in which the transmitted signal is corrupted mainly by additive white Gaussian noise (AWGN), such as wireless transmissions, for example, cell phones and radios.

Convolution codes are usually described using two parameters: the code rate and the constraint rate. The code rate, k/n, is expressed as a ratio of the number of bits into the convolutional encoder (k) to the number of channel symbols output by the convolutional encoder (n) in a given encoder cycle. The constraint length parameter, K, denotes the "length" of the convolutional encoder, i.e., how many k-bit stages are available to feed the combinatorial logic that produces the output symbols. Closely related to K is the parameter m, which indicates how many encoder cycles an input bit is retained and used for encoding after it first appears at the input to the convolutional encoder. The m parameter can be thought of as the memory length of the encoder.

Viterbi decoding is one of two types of decoding algorithms used with convolutional encoding, the other type being sequential decoding. Sequential decoding has the advantage that it can perform very well with long-constraint-length convolution codes, but it has a variable decoding time. Viterbi decoding has the advantage that it has a fixed decoding time. It is well suited to hardware decoder implementation, but its computational requirements grow exponentially as a function of the constraint length, so it is usually limited in practice to constraint lengths of K=9 or less. Viterbi decoding algorithms are typically used for decoding trellis-coded modulation, the technique of squeezing high ratios of bits-per-second through bandwidth limited channels. In general, Viterbi algorithms were originally conceived as an error-correction scheme for noisy digital communication links. However, it is now also used in information theory, speech recognition, keyword spotting, computational linguistics bioinformatics, as well as other applications.

Viterbi decoding determines the path with the minimum path metric through the trellis, with the path metric being defined as the sum of the branch metrics along the path. This is done in a step wise manner by processing a set of state metrics forward in time, stage by stage over the trellis.

The complexity of Viterbi algorithms lies in the computation of $2^{k-1}$ path metrics for a constraint K decoder at each time stage. A processor that implements a Viterbi decoder typically includes three major blocks: the branch metrics calculation unit (BMU), the add-compare-select unit (ACS), and the survivor path decoding unit. The branch metrics unit typically performs the calculation of distances of sampled signals from targets, which are Euclidean in the case of AWGN. New branch metrics are computed for each incoming sample, at every clock cycle.

Similarly, a new value of the state metrics has to be computed at each time instant. In other words, the state metrics have to be updated every clock cycle. As a result, common approaches of recursive and pipelining processing are not applicable for increasing the throughput of the system. Hence the ACS unit is the module that consumes the most power and area (when implemented on a chip).

The survivor management unit (SMU), or trace back block or mechanism, is responsible for tracing back through the trellis using the survivor bits to reproduce the original input bits. In tracing back, the shortest path through the trellis must be traced. The selected minimum metric path from the ACS output points the path from each state to its predecessor. In theory, decoding of the shortest path would require the processing of the entire input sequence. However, in practice, the survivor paths merge after some number of iterations. From the point they merge together, the decoding is unique. The trellis depth at which all the survivor paths merge with high probability is referred to as the survivor path length.

The Viterbi algorithm is therefore effective in achieving noise tolerance, but the cost is an exponential growth in memory, computational resources, and power consumption. Various approaches have been suggested to address this issue, including an adaptive Viterbi algorithm (e.g., Tessier, R. et al., "A Reconfigurable, Power-Efficient Adaptive Viterbi Decoder", publication date unknown), and a dynamically reconfigurable adaptive Viterbi decoder (e.g., S. Swaminathan et al., "A Dynamically Reconfigurable Adaptive Viterbi Decoder"; and Chadha, K. et al., "A Reconfigurable Viterbi Decoder Architecture" IEEE Publication Number 0-7803-7147-X/01, pp. 66-71 (2001), and FPGA '02, Feb. 24-26, 2002, Monterey Calif., ACM 1-58113-452-5/02/0002, pp 227-236 (2002), Liang et al., "A Dynamically-Reconfigurable, Power-Efficient Turbo Decoder", Proceedings of the 12th Annual IEEE Symposium on Field-Programmable Custom Computing Machines (FCCM'04) (exact date of publication unknown), and Chadha, K, "A Reconfigurable Decoder Architecture for Wireless LAN and Cellular Systems", Master Thesis, Rice University, April, 2001); Zhu et al., "Reconfigurable Viterbi Decoding Using a New ACS Pipelining Technique, Proceeding of the Application-Specific Systems Architectures and Processors (ASAP'03) (exact date of publication unknown), Yeh et al., "RACER: A Reconfigurable Constraint-Length 14 Viterbi Decoder", 0-8186-7548-9/96, pp. 60-69 (1996), and Zhan et al, "Domain Specific Reconfigurable Fabric Targeting Viterbi Algorithm" ICFPT 2004 0-7803-8652-3/04 IEEE (2004), pp. 363-366.

Figure 1:
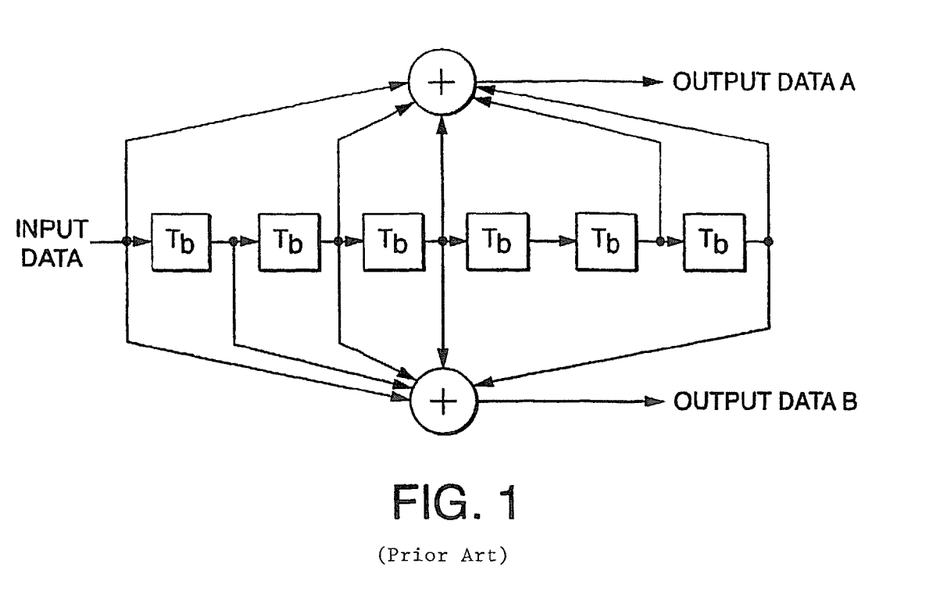
FIG. 1 illustrates a non-recursive systematic Viterbi decoder with constraint length K=7.
Figure 2:
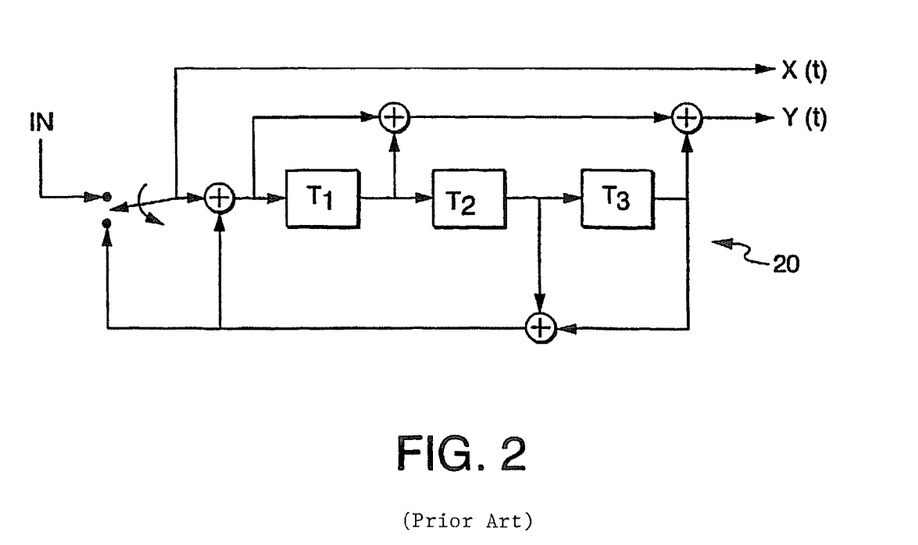
FIG. 2 illustrates a recursive systematic Viterbi coder with constraint length K=4 as used inside WCDMA turbo codes.

Shift register convolution decoders of the Viterbi decoding algorithm for both recursive and non-recursive systematic codes is a critical computational block, e.g., in modems and other communication devices. They are used, for example, in channel decoders, ML (Maximum Likelihood) equalizers, ML decoders of space-time codes for MIMO RF antennas, and ML filtering to name a few. An interesting feature of shift register convolution decoders of Viterbi decoding algorithms for recursive systematic and non-recursive systematic codes is that they can be operated in a parallel, serial or hybrid (serial-parallel) form by using an adjustable reconfigurable network of ACS blocks, BMU generators with adjustable reconfigurable connections to the ACS network, and adjustable reconfigurable trace-back mechanisms for recursive systematic and non recursive systematic forms. Hence, the same hardware can be employed for both recursive systematic and non-recursive systematic codes with various constraint lengths K and generator polynomials. FIG. 1 illustrates an example of a non-recursive systematic Viterbi decoder with constraint length K=7, while FIG. 2 illustrates an example of a recursive systematic Viterbi coder with constraint length K=4 as used inside WCDMA turbo codes.

In a standard implementation, to provide function-specific reconfigurability it is first necessary to analyze the computational structure. Typically, the Viterbi decoder has a shuffle-exchange interconnect structure of ACS blocks, which varies with the size of the constraint length K, the type of recursive systematic codes and/or non-recursive systematic codes and, for the latter a chosen feedback generator polynomial. Furthermore, the connections of the outputs bearing the BMU values within the ACS network depend on the code generator polynomial (the number of distinct polynomials. i.e., the code rate; for example, a rate ½ has two generator polynomials, while a rate ¼ code has four generator polynomials, etc.). It is thus difficult to provide flexibility to the most energy-efficient fully-parallel implementations, where the implementations are typically constrained by the code rate for which the implementation is designed.

Figure 3:
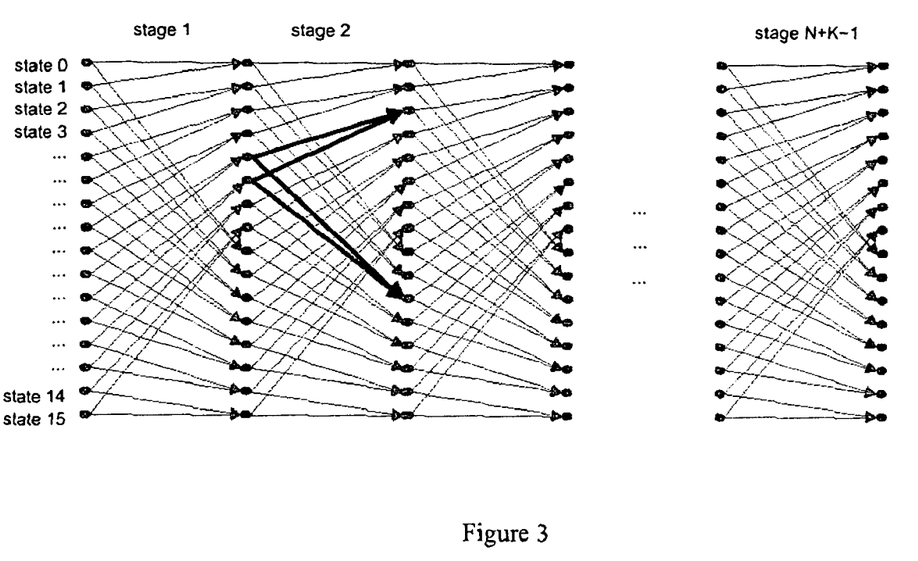
FIG. 3 illustrates a non recursive systematic Viterbi decoder with constraint length K=5.

In a fully parallel implementation the signal flow graph is directly mapped onto hardware. In general, the constraint length K code decoder requires $2^{k-1}$ ACS butterfly units. For instance, for a non-recursive systematic code with constraint length K=5 i.e., a 16-state Viterbi decoder, there is a total of 16 ACS butterflies at each stage, and they are interconnected in a manner as shown in FIG. 3 (in the figure the time advances from left to right). This maximum parallel architecture has the potential for high performance and a low power consumption implementation; however, it bears a high cost of large silicon area, especially for large constraint length decoders.

When the implementation is done in fixed-point arithmetic, the scaling and overflow handling are crucial for correct behavior of the transformer. The ACS butterfly operation at each stage of the decoder uses an "addition in 2's complement" so that if the state metrics have enough bits (one bit more than the number of bits needed for representing the maximum difference between metrics for a given constraint length K), the addition of 2's complement properties will fulfill the resealing without additional hardware. Thus, for a reconfigurable decoder design, it is enough to have a bit representation for the metrics corresponding to the maximum difference that is required. Designing a reconfigurable implementation therefore depends on: (1) the biggest constraint length K that the reconfigurable implementation of the shift register convolution decoder is able to handle, and (2) the maximum expected BMU generator rate. Such a design will result in the needed rescaling for all the constraint lengths equal to or less than the maximum expected constraint length K and rate. The referenced prior art to reconfigurable architecture is not completely satisfactory because the referenced decoders are each reconfigurable to or adapted to process only one type of Viterbi algorithm, thus limiting the application of the decoders. Further limitations result because such designs fix the level of parallelism, i.e., do not allow flexibility in the parallel-serial structure, even though the level of parallelism can vary depending on the Viterbi algorithm decoded. Finally, where simpler codes are implemented (e.g., with k=3), current designs simply switch off unused hardware.

DETAILED DESCRIPTION OF THE DISCLOSURE

In accordance with the system and method disclosed herein, a reconfigurable decoder having an architecture that configured so as to decode both recursive and non-recursive systematic codes, in accordance with various types of Viterbi decoding algorithms, of varying constraint length K and generator polynomials. In an embodiment of the system and method, the system and method allow implementation of a shift register convolution decoder of recursive and non-recursive systematic codes by a plurality of types of Viterbi decoding algorithms through a wide range of parameters by fast (i.e., substantially in real-time) on-line reconfiguration of the hardware (i.e., without introducing noticeable delays). The system and method are reconfigurable to accommodate any one of many types of Viterbi decoding algorithms, and can accommodate a plurality of different types of Viterbi decoding algorithms simultaneously in substantially real time. The system and method further allow for a significant decrease in the amount of hardware intended for parallel or serial implementations of the type comprising a plurality of shift register convolution Viterbi decoders. The system and method are also efficient in implementing adaptive ML (Maximum likelihood) algorithms where the size of the constraint length K and generator polynomials vary, and are determined on-line and dependent on the input to the algorithm.

A reconfigurable pipelined architecture can be designed in accordance with this disclosure for implementing a Viterbi algorithm decoder with very low energy overhead even compared with the standard low complexity Viterbi decoders.

Figure 4:
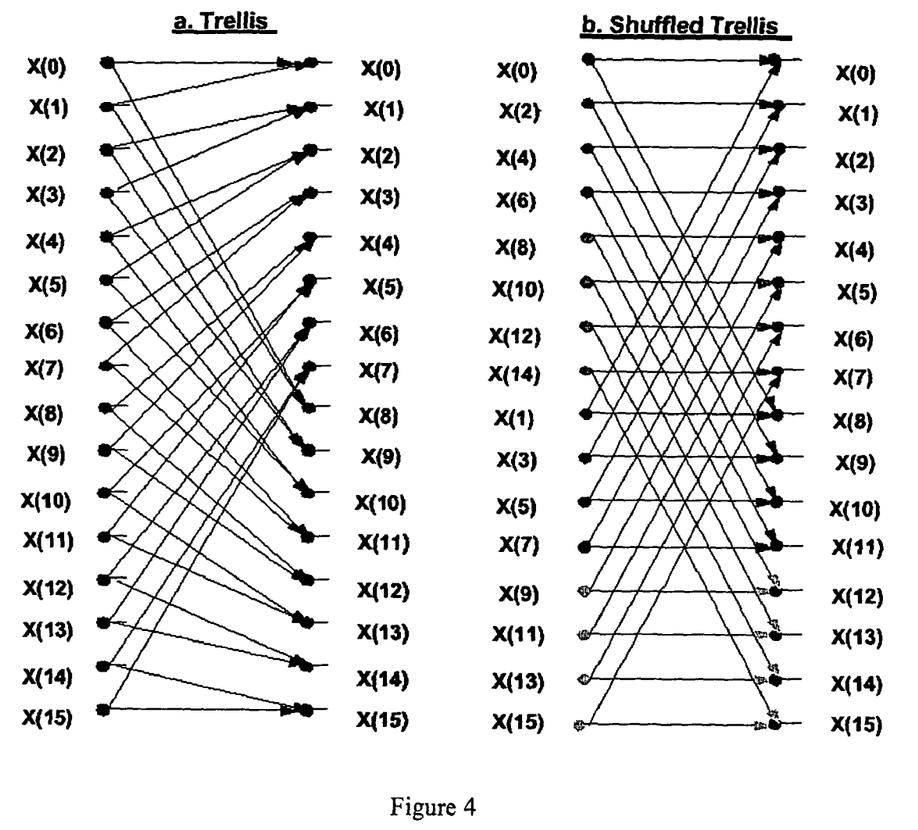
FIG. 4 illustrates an example of trellis shuffling for a Viterbi decoder with constraint length K=5.
Figure 5:
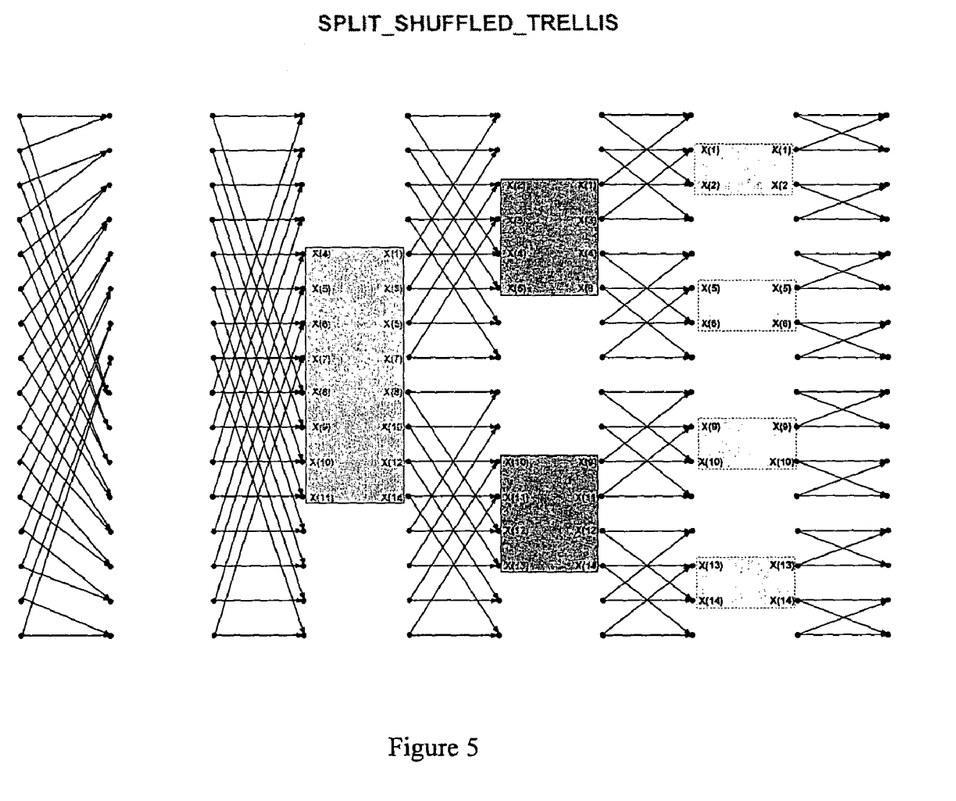
FIG. 5 illustrates an example of trellis shuffling splitting for a parallel Viterbi decoder when the maximum constraint length is K=5.

Decoders utilizing radix-2 ACS butterflies are of particular interest since this type of architecture provides the minimum multiplicative complexity. This spatial regularity is a great structural advantage over other algorithmic bases for an VLSI implementation. One aspect lending simplicity behind a reconfigurable architecture using the radix-2 ACS butterflies is that the connection networks can be rearranged so as to use minimum switching points. For a non-recursive systematic code the shuffled trellis structure can reveal the best switching structure. For example the shuffled K=5 trellis structure shown in FIG. 4 can be split into two K=4 shuffled trellises structures, which in turn can be split further, and so on until eight K=2 shuffled trellises structures are provided. In FIG. 5, each box is a cross multiplexer (MUX) that splits the trellis at each step. If each box is controlled by a different control function then the basic K=5 shuffled trellis can be broken into any combination of trellises for a non-recursive systematic code for any K that occupies the maximum number of K of ACS states in the fully parallel trellis.

The shuffled trellis architecture can be of use also for serial implementation if a large K is needed, although this will decrease the decoding speed rate. The speed rate reduction is a factor of $2^{K-TrellisK}$, when K is a larger K and Trellis K is the maximum K that can be provided in a parallel arrangement (so that $2^{TrellisK-1}$ is the number of ACS butterfly units embedded in the design).

Figure 6:
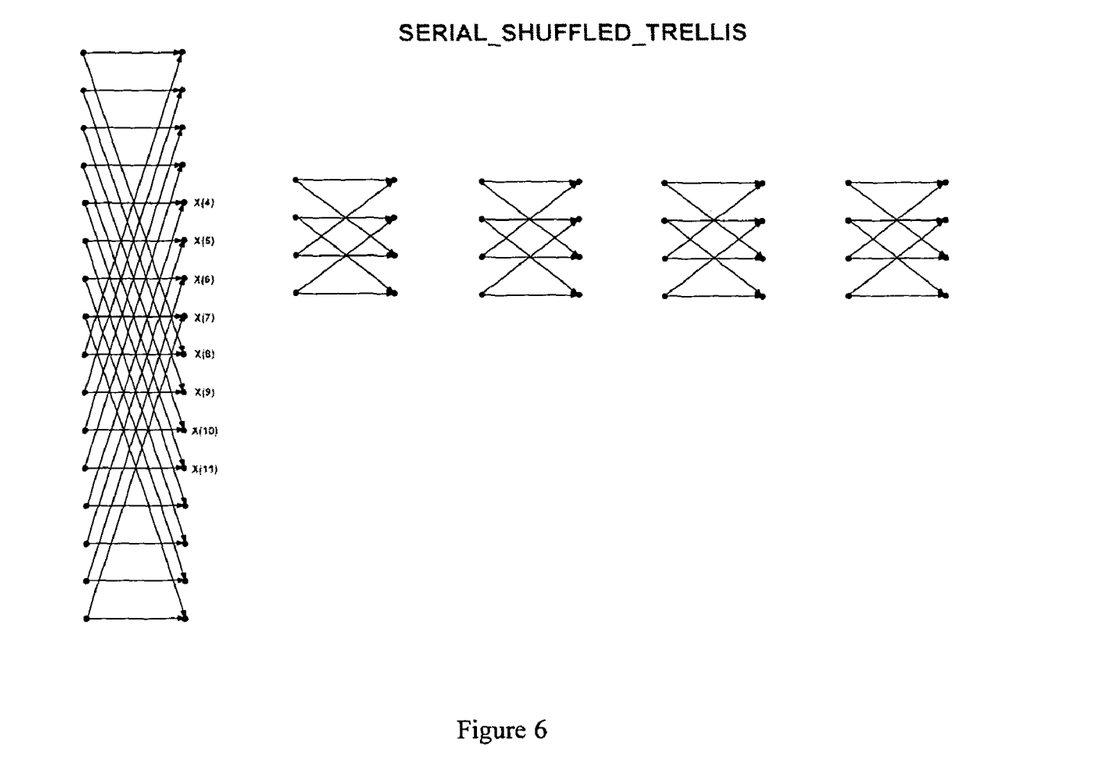
FIG. 6 illustrates an example of parallel Trellis shuffling for a Viterbi decoder when the maximum constraint length K=5 compared with a serial implementation of Viterbi decoder constraint length K=5 based on shuffled trellis of constraint length K=3.

For example, the shuffled K=5 in parallel design would comprise 16 ACS butterfly units (left hand in the FIG. 6), while the same K=5 is achieved using four times a K=3 shuffled trellis (right hand in the FIG. 6). When, for example, the extra hardware is RAM for the 16 metrics in double buffer, the data corresponding to each ACS needs to be saved as 4 metrics in double buffer. This method can be used to build a reconfigurable Viterbi decoder in as a full parallel architecture, full serial architecture or any combination of parallel and serial architecture, which in turn determines the number of ACS butterfly units employed. As can be seen from the above, each constraint length K will be implemented in the reconfigurable Viterbi decoder where the maximum parallel capability is provided, resulting in the maximum efficiency due to the proposed architecture.

Other hardware for achieving the advantages of reconfigurable hardware is the trace back block. The trace back block provides low power consumption and is suitable also for a large constraint length K (where the shift register mechanism would require a relatively large amount of hardware and require large amounts of power). A trace back block is also suited for reconfiguration, as will be seen below. In the reconfigurable case, the memory length needs to be big enough, more than the maximum constraint length by a factor of 10, to save in hardware requirements. In such a case only two trace back blocks need to work in parallel for a full pipeline architecture.

Figure 7:
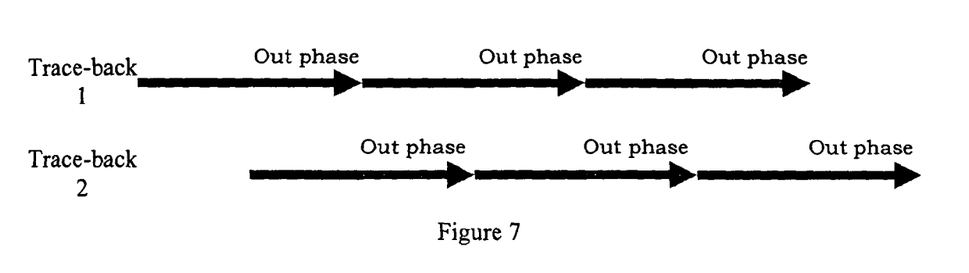
FIG. 7 is an illustration of a windowing depiction of a trace back operation.
Figure 8:
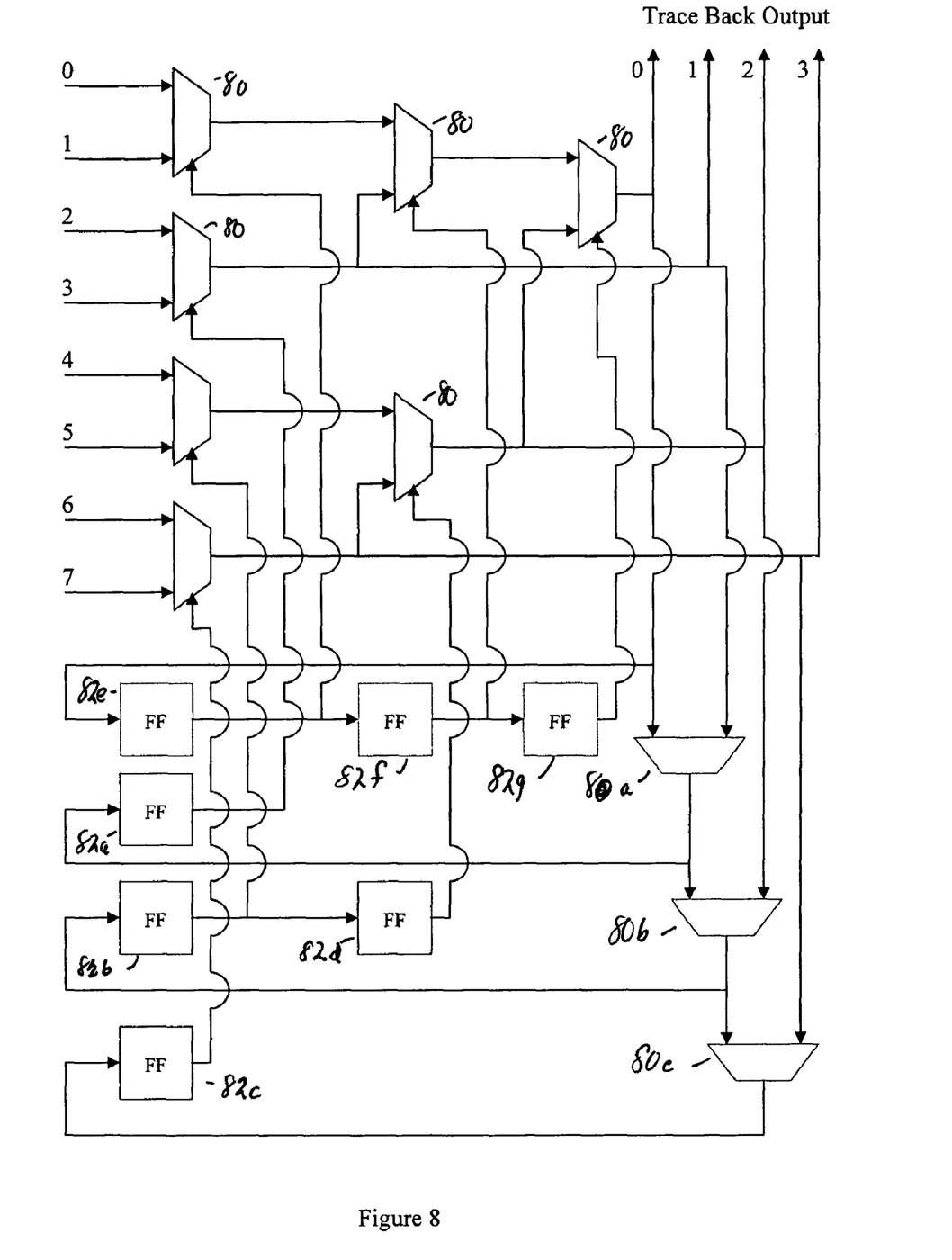
FIG. 8 is a block diagram of a reconfigurable controller for performing the trace-back operation for constraints up to K=4.

FIG. 7 illustrates the window operation of an example of two trace back blocks working in parallel. In such a case only controlling on the Write and Read addresses will do for any number of traceable lengths needed for the optimal performance and delay. An example of implementation is shown in FIG. 8 for splitting the memory in the trace back mechanism within the ACS shuffled trellis network for the maximum constraint length K=4 for a non-recursive systematic code. The hardware comprises a plurality of MUXs 80 used for picking up corresponding decoded bits that are governed by several shift registers (here FF 82 are flip flops) The FIG. 8 embodiment includes four outputs. The four outputs correspond to the possibility of using several Viterbi decoders in parallel. The FIG. 8 embodiment illustrates an implementation of one possible collection of parameters. The output 0 is used for outputting the results of decoding of a K=4 Viterbi algorithm (and in this instance, it is necessary to implement only one decoder). In case there are two decoders (say, K=3 and K=1) the outputs of the two decoders will appear at 0 and 1 respectively.

In general, the outputs are split between several parallel decoders. The output 0 can be used for a K=4 decoder (the only one), or K=3 (the first and largest output of the several decoders), or K=2 (again the first one). One can also use the output of the second decoder with K=2 (this is marked as Number 2), and so forth. Thus, the out puts 0, 1, 2 and 3 are examples respectively of the possible outputs of four parallel decoders. Thus, the hardware configuration can provide anywhere from one to four decoders that can operate simultaneously.

The output number indicates the number of possible outputs of parallel decoders. Thus, the output 0 provides for an output when K=4, or K=3, or K=2 (when only one decoder is used), output 1 provides for an additional output when K=2 (when two decoders are used), output 2 provides an additional output when K=3 (when two decoders are used) or K=2 (when three decoders are used), and output 3 provides an additional output for K=4 when four decoders are used.

This method permits full usage of the hardware by adding the flip flops 80a, 80b, 80c and 80d, and shift registers 82a, 82b and 82c as shown in FIG. 8. Thus, a negligible amount of hardware for a reconfigurable design is necessary to permit full usage of the silicon.

In FIG. 8 the inputs 0-7 are preferably the outputs from memory corresponding to the reliability values for distinct paths in the trellis diagram. The MUXs 80d, 80e, 80f, 80g, 80h, 80i and 80j are acting in such a way that the decoding results are provided at one or more of the trace back outputs 0, 1, 2 and 3 (up to 4). The MUXs 80a, 80b and 80c are reconfigured in such a way that they pass the signals to configure the network to the predefined number of decoders of given sizes. The flip flops 82a, 82b, 82c, 82d, 82e, 82f, 82g are then intended for reconfiguration of the network in such a way that either the trace back output 0 corresponds to the maximum of the first four inputs (K=3), while the trace back output 2 corresponds to the maximum among the last four inputs (also K=3), etc. In general, the architecture allows any combination of up to 4 decoders of K=2 (as explained above) to run in parallel. The embodiment of FIG. 8 does not, necessarily work for accommodating recursive systematic codes because of the requirement for the feedback polynomial.

Figure 9:
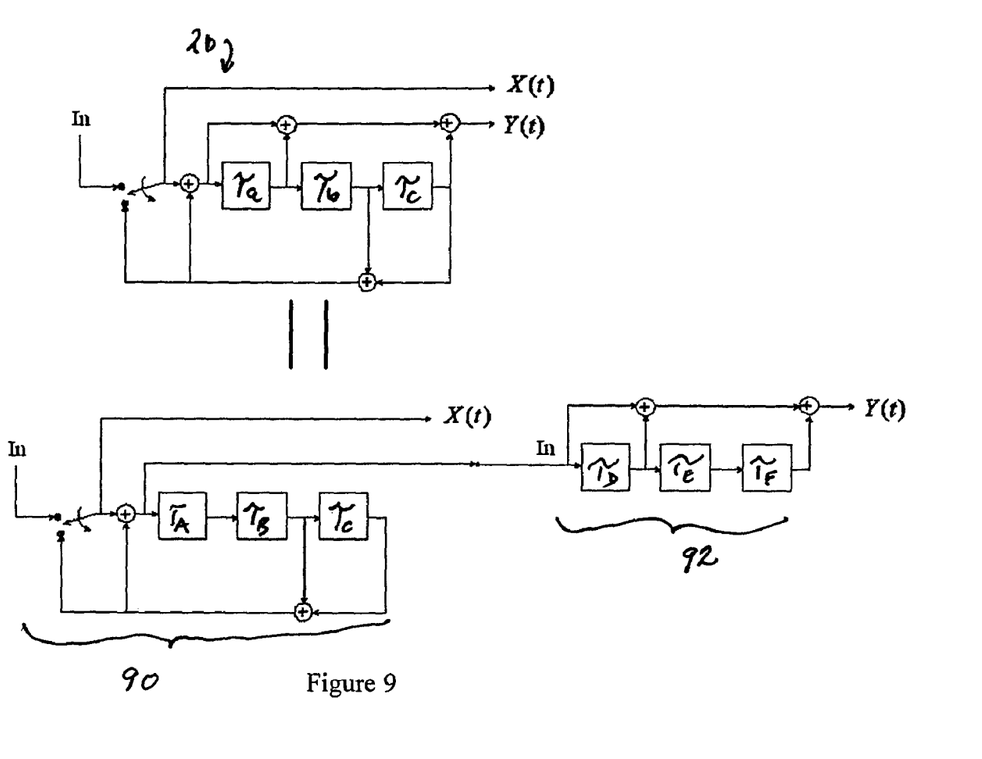
FIG. 9 is a block diagram of an example of a concatenated system for scrambling recursive systematic code with non-recursive systematic code, as used in WCDMA turbo codes, where K=4 for the recursive systematic codes.
Figure 10:
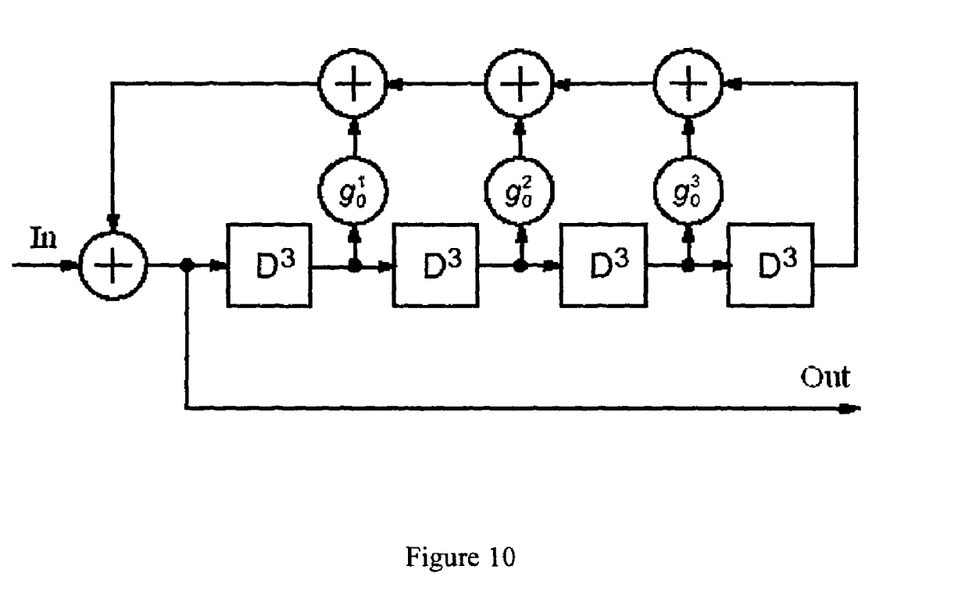
FIG. 10 is a block diagram of an example of a reconfigurable scrambler, wherein K≦5, $g_0^1$ represents the feedback polynomial implemented by controlling the AND gates, and + represents a XOR gate.

To overcome this obstacle, in order to use the same reconfigurable architecture for accommodating both recursive and non-recursive systematic codes, it is necessary to use properties of recursive systematic codes so that they appear and are processed as non-recursive systematic codes. This is preferably accomplished by combining the block including the architecture of FIG. 8 for accommodating non-recursive systematic codes with a scrambler that is built from shift registers and the feedback polynomial as seen in FIG. 9. FIG. 9 illustrates an example of a recursive systematic code Viterbi decoder including a scrambler 92 concatenated with a non-recursive systematic code decoder 90, as for example, used in WCDMA turbo codes, with K=4 for recursive systematic codes. In FIG. 9, the upper part represents the encoder 20 of the recursive systematic convolutional code with K=4 appearing in the UMTS standard, duplicated from FIG. 2. This design is equivalent to the design below, including in the left-side part, the direct output connection for the systematic portion, and shift register (scrambler) connected to encoder of rate 1 convolutional code (appearing on the right of the scheme). Thus, the decoding of non-recursive systematic code can be accomplished. A reconfigurable descrambler can be added following the trace back block. Another issue is that the BMU connections to the ACS network trellis need to be suitably pre-configured because some of the soft symbols are provided at the output of the scrambler. However, such is determinative, so once computed pre-configuring the architecture is fixed in time, and connections between the BMU and the ACS trellis network can be reconfigured without any modification. Therefore, the only change in the architecture is adding components to provide reconfigurable scrambling at the end of the trace back blocks which are also negligible silicon overhead. This overhead can be reduced to a minimum if using the trace back reconfigurable controlling shift registers (flip flops 80a, 80b, 80c, 80d, 80e, 80f, 80g, and shift registers 82a, 82b and 82c shown in FIG. 8). To show this, the scrambling in FIG. 9 embodiment can be easily implemented by addition of an XOR gate on the output of the shift register comprised of flip-flops shown in FIG. 8. A reconfigurable scrambler can include an array of AND gates that are XOR'ed between them as best seen in FIG. 10. FIG. 10 uses conventional notation, wherein $g_0^1$, $g_0^2$ and $g_0^3$ are coefficients of the defining polynomial of the scrambler, the circle means the bit-wise AND operation, the circle with the + represents the XOR operation. The values of the coefficients are varying and can be set by external control signals.

Figure 11:
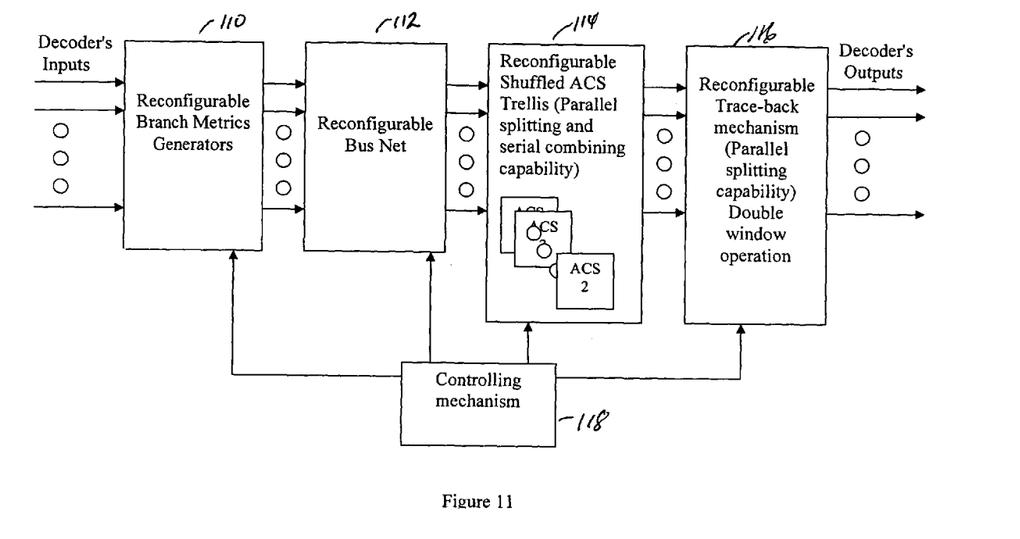
FIG. 11 is a block diagram of a preferred embodiment of an architecture for providing a reconfigurable Viterbi decoder using a MF-I core processor in accordance with one aspect of the method and system of the present disclosure.
Figure 12:
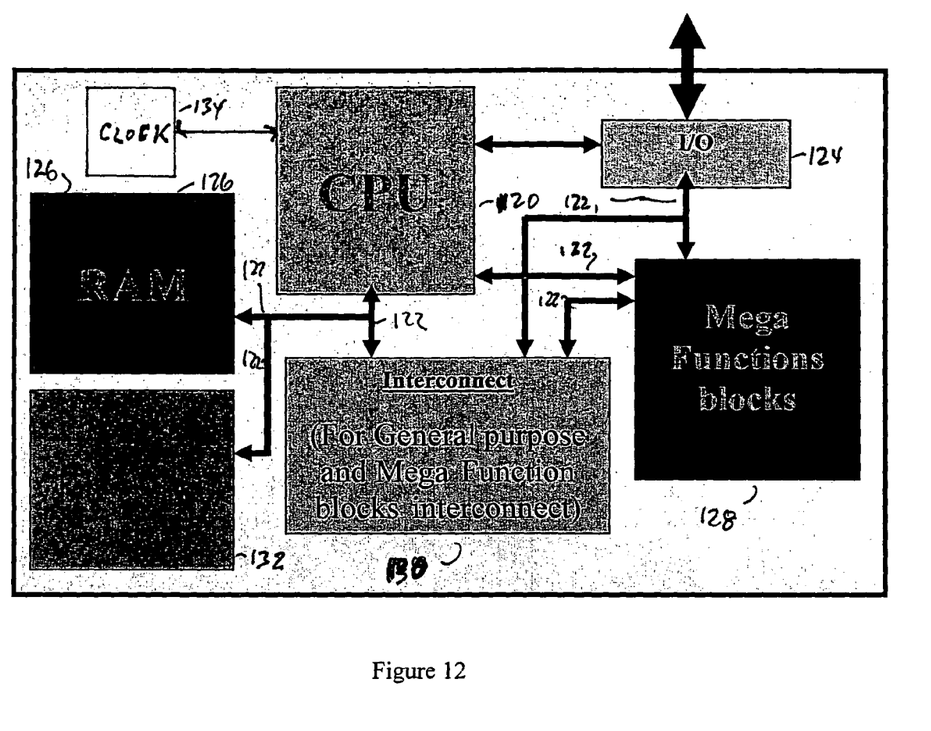
FIG. 12 is a block diagram of a communication system configured to comprise a reconfigurable Viterbi decoder of any of the type described herein.

FIG. 11 is an example of a general architecture of a device designed in accordance with the disclosed approaches. The architecture is capable of implementing a reconfigurable convolution decoder for decoding both recursive and non-recursive systematic codes in accordance with a Viterbi decoding algorithm of varying constraint length K and generator polynomials. The device preferably comprises reconfigurable branch metrics generator blocks 110, which generate signals that are transmitted to a reconfigurable BUS NET 112. The latter in turn provides signals to a reconfigurable shuffled ACS Trellis block 114, preferably comprising a plurality of ACS 2 components selectively interconnectable with parallel splitting and serial combining capability in every possible combination. The output of reconfigurable ACS Trellis block 114 is applied to a reconfigurable trace-back mechanism block 116 preferably with parallel splitting capability and double window operation. A control mechanism block 118 is preferably coupled to the blocks 110, 112, 114 and 116 for reconfiguring the blocks 110, 112, 114 and 116, so as to decode signaling in accordance with a Viterbi algorithm, regardless of whether recursive or non-recursive systematic codes are received and as a function of varying constraint length K and generator polynomials. In this regard any system employing this embodiment will necessarily have to sense and properties of the Viterbi decoding algorithm(s) needed to decode the encoded signals being processed. A specific application of the foregoing is described in our co-pending application, U.S. Ser. No. 11/071,340, filed Mar. 3, 2005 and entitled Low-Power Reconfigurable Architecture For Simultaneous Implementation Of Distinct Communication Standards, which is incorporated by reference. FIG. 12 shows a block diagram of a system described and claimed in this co-pending application.

Accordingly, as illustrated in FIG. 12, an embodiment of an integrated chip made to comply with the foregoing chip architecture requirements will comprise the following basic functional components:

CPU 120 is preferably a relatively small computer processing unit needed for (a) controlling the configware part of the device i.e., net bus 122, I/O block 124, RAM block 126, megafunction block(s) 128, interconnect block 130, flash memory block 132 and clock 134 and (b) fixing the configuration of the megafunctions block(s) 128, as well as the bus 122, I/O block 124, RAM block 126, interconnect block 130, flash memory block 132 and clock 134, depending upon the protocol of the signals be processed by the chip. CPU 120 can also help by computing minor and simple assignments or tasks, and configuring the bus that is used to interconnect the megafunctions and the I/O block.

The net bus 122 is reconfigurable depending on the protocol. I/O block 124 is preferably a configurable I/O block that connects the chip with the outside world. Its tasks include receiving the "compiled software" of the application algorithm, and receiving input data and delivering output-processed data. RAM 126 is a random access memory preferably configured to store the "compiled software instructions", and to cache and buffer data. Megafunctions block 128 is preferably configured to include the major application functions of two or more applications, i.e., protocols, which are processed by computing each domain of the application functions as one function with extraordinary efficiency. In the present case, the megafunction block 128 is configured to include one or more of the trellis-type decoders, or any combination thereof, described herein. Interconnect block 130 preferably includes the reconfigurable net bus, which connects all the components of the chip including the CPU 120, I/O block 124, RAM 126, Megafunctions block 128, and Flash Memory 132 and Clock block 134. The interconnect block can also be configured to perform minor and simple assignments or tasks, preferably in extra memory. Finally, flash memory 130 preferably serves to store data as the chip runs through its programs. Flash memory is preferably in the form of EEPROM that allows multiple memory locations to be erased or written in one programming operation, so that it can operate at higher effective speeds when the systems using it read and write to different locations at the same time. It should be appreciated that for less complex operations, other types of memory could be used. Information is preferably stored in the flash memory by storing the information on a silicon chip in a way that does not need power to maintain the information in the chip. Consequently, power to the chip can be withdrawn and the information retained in flash memory without consuming any power. In addition, flash memory offers fast read access times and solid-state shock resistance, making flash memory particularly desirable in applications such as data storage on battery-powered devices like cellular phones and PDAs.

The architecture thus described, thus can be implemented as an integrated circuit. The architecture is believed adaptable for any type of trellis decoding, in which the constraint K can vary in size for both recursive and non-recursive systematic codes. Such trellis decoding can contain, but not restricted to algorithms operating on vectors having varying size (of type hard decision [HD] or soft decision [SD] vectors): convolution code decoding, Trellis code modulation decoding [TCM], Convolution Turbo Codes [CTC] decoding, small block codes decoding (like BCH, Hamming etc'), Block/Product turbo code decoding (BTC/PTC) and MLSE/RSSD/RSSE/Per Survivor Processing (PSP) type equalization/filter/MIMO & space-Time decoding computations (based on convolution/trellis or block or of a concatenated codes to form turbo like space time code). The decoding procedure of the above codes/filter can any combination of HD and SD as HIHO (Hard In Hard Out), SIHO (Soft In Hard Out) or SISO (Soft In Soft Out) with varying size of Soft values Bit size symbols and various size of K values of the codes.

In addition to the foregoing, the architecture can provide reconfigurable architecture resources that are parameterized so as to implement trellis decoding of any of the algorithms. Further, the reconfigurable architecture can include dedicated resources for the trellis decoding of any of the algorithms, such as utilizing the RAM 126 of FIG. 12. The reconfigurable architecture can be implemented as a part of a DSP processor, reconfigurable logic architecture, programmable processing (software or firmware), or a combination of two or more of these approaches. As previously described, the reconfigurable architecture can be a configurable accelerator for use in a reconfigurable modem. The reconfigurable network can include ACS blocks in the form of ACS butterflies. The reconfigurable network of ACS blocks can based upon a Radix architecture, such as Radix 2, Radix 4 and Radix 8 architecture. In addition, the architecture, such as shown in FIG. 12 can include reconfigurable hardware for running algorithms relating to power spectrum analyzing, equalizing, synchronization, MIMO processing and correlating. The reconfigurable architecture such as the one employed in the FIG. 12 embodiment can also be reconfigurable to include trellis blocks for performing one or more of the following: MLSE, RSSE and PSP techniques to estimate channel and parameters used in one or both of the physical and MAC layers of a communication protocol used to transmit the vectors. Further, the decoder can include buses that can be dynamically changed as a function of algorithms used to process vectors received by the reconfigurable architecture. The reconfigurable architecture allows for simultaneous decoding of different trellis type decoding algorithms. It should be evident that the reconfigurable architecture can include the necessary hardware and software for determining the nature of the vectors received, and the necessary decoding that needs to take place, as described in. Once determined, the architecture is reconfigured, all as described in our co-pending application, U.S. Ser. No. 11/071,340, filed Mar. 3, 2005 and entitled Low-Power Reconfigurable Architecture For Simultaneous Implementation Of Distinct Communication Standards, which is incorporated by reference.

The decoder can further include memory and at least one parameterized block, wherein values of parameters for the parameterized block are stored in memory, such as the RAM 126 of the FIG. 12 embodiment, and used to set the values of the parameters. The decoder can also further include an input for receiving values of parameter settings externally of the architecture, such as providing such an input to the architecture shown in FIG. 12, or store the necessary parameters in memory (such as RAM 126) and at least one parameterized block, wherein values of parameters for the parameterized block are received at the input and used to set the values of the parameters.

Control signals either stored or provided externally through an input to the system architecture for reconfiguring the network in response to the decoder algorithms used to decode the vectors received by the system architecture. Further data representative of a set of configuration signals representing all of the possible configurable networks of ACS blocks, BMU generators and trace-back mechanisms for both recursive and non-recursive systematic forms, and configurable connections between the ACS blocks, BMU generators and trace-back mechanisms, can be either stored in memory (or the configuration signals can provided externally though an input to the system architecture) so that (a) the reconfigurable network and (b) reconfigurable connections are arranged so as to be responsive to the configuration signals. The data representative of the set of configuration signals could include information relating to parameters and algorithms used to decode vectors received by the reconfigurable architecture.

As previously described the architecture can include an analyzer configured so as to determine the systematic trellis codes used to encode the vectors received by the reconfigurable architecture, wherein the reconfigurable network and reconfigurable connections are configured as a function of the determination of such systematic trellis codes.

The architecture of the present disclosure as disclosed herein, and all elements thereof, are contained within the scope of at least one of the following claims. No elements of the presently disclosed chip architecture are meant to be disclaimed, nor are they intended.

What is claimed is:

1. A reconfigurable architecture of a core for use in decoding one or more vectors received by the core in accordance with any one of a plurality of recursive and/or non-recursive systematic trellis codes of varying sizes and constraints K, as well as generator polynomials, the architecture comprising:
   a decoder including (a) a reconfigurable network of ACS blocks, BMU generators and trace-back mechanisms for both recursive and non-recursive systematic forms, and (b) reconfigurable connections between the ACS blocks, BMU generators and trace-back mechanisms, arranged so that a precise number of network components can be adaptively rearranged by splitting and merging the components in time and space, and interconnected in a network as a function of size and the constraint K and a generator polynomial of each code used for encoding the vectors received by the core.

2. A reconfigurable architecture according to claim 1, wherein the vectors received by the core include hard decision and/or soft decision vectors.

3. A reconfigurable architecture according to claim 1, wherein the vectors received by the core include convolution code.

4. A reconfigurable architecture according to claim 1, wherein the vectors received by the core include trellis code modulation .

5. A reconfigurable architecture according to claim 1, wherein the vectors received by the core include convolution turbo code.

6. A reconfigurable architecture according to claim 1, wherein vectors received by the core include short block code.

7. A reconfigurable architecture according to claim 1, wherein the vectors received by the core include block/product turbo code.

8. A reconfigurable architecture according to claim 1, wherein the decoder is configurable so as to perform steps including one or more of the following:
equalization, filtering MIMO & space-time decoding computations.

9. A reconfigurable architecture according to claim 1, wherein the decoder is reconfigurable so as to perform decoding and or filtering any combination of hard decision and soft decision vectors as HIHO (Hard In Hard Out), SIHO (Soft In Hard Out) or SISO (Soft In Soft Out) with varying size of Soft values, Bit size symbols and various sizes of K values of the codes.

10. A reconfigurable architecture according to claim 1, further configured so as to include an accelerator configured to perform at least some of the steps of decoding each of the vectors.

11. A reconfigurable architecture according to claim 1, wherein the reconfigurable network of ACS blocks, BMU generators and trace-back mechanisms for both recursive and non-recursive systematic forms are reconfigurable so as to implement trellis decoding of the type comprising at least one of the algorithms operating on vectors having varying size, including both hard decision [HD] or soft decision [SD] vectors, convolution code decoding, Trellis code modulation decoding [TCM], Convolution Turbo Codes [CTC] decoding, small block codes decoding, including BCH Hamming, block/product turbo code decoding (BTC/PTC) and MLSE/RSSD/RSSE/Per Survivor Processing (PSP) type equalization/filter/ MIMO and space-Time decoding computations based upon convolution/trellis, block or concatenated codes to form turbo like space time code, any combination of HD and SD as HIHO (Hard In Hard Out), SIHO (Soft In Hard Out) or SISO (Soft In Soft Out) with varying size of soft values, bit size symbols and various sizes of K values of the codes.

12. A reconfigurable architecture according to claim 11, wherein at least some of the reconfigurable architecture resources are parameterized so as to implement trellis decoding of any of said algorithms.

13. A reconfigurable architecture according to claim 11, wherein the reconfigurable architecture includes dedicated resources for the trellis decoding of at least one of said algorithms.

14. A reconfigurable architecture according to claim 11, wherein the reconfigurable architecture is further configured so as to include an accelerator configured to perform at least some of the steps of decoding each of the vectors.

15. A reconfigurable architecture according to claim 1, wherein said reconfigurable architecture is a part of a DSP processor.

16. A reconfigurable architecture according to claim 1, wherein the reconfigurable architecture is in the form of reconfigurable logic architecture.

17. A reconfigurable architecture according to claim 1, wherein the reconfigurable architecture is in the form of programmable processing.

18. A reconfigurable architecture according to claim 1, wherein the reconfigurable architecture is in the form of two or three of the following:
(a) a part of a DSP processor;
(b) in the form of reconfigurable logic architecture; and
(c) in the form of programmable processing.

19. A reconfigurable architecture according to claim 1, wherein the reconfigurable architecture is a configurable accelerator for use in a reconfigurable modem.

20. A reconfigurable architecture according to claim 1, wherein the reconfigurable network of ACS blocks includes ACS butterflies.

21. A reconfigurable architecture according to claim 1, wherein the reconfigurable network of ACS blocks is based upon a Radix architecture.

22. A reconfigurable architecture according to claim 1, wherein the reconfigurable network of ACS blocks are reconfigurable as a Radix 2, Radix 4 and Radix 8 architecture.

23. A reconfigurable architecture according to claim 1, wherein the reconfigurable architecture includes reconfigurable hardware for running algorithms relating to power spectrum analyzing, equalizing, synchronization, MIMO processing and correlating.

24. A reconfigurable architecture according to claim 1, wherein the reconfigurable architecture is reconfigurable to include trellis blocks for performing at least one of the following: MLSE, RSSE and PSP techniques to estimate channel and parameters used in one or both of the physical and MAC layers of a communication protocol used to transmit the vectors.

25. A reconfigurable architecture according to claim 1, wherein the decoder includes buses that can be dynamically changed as a function of algorithms used to process vectors received by the reconfigurable architecture.

26. A reconfigurable architecture according to claim 1, wherein the decoder further includes memory and at least one parameterized block, wherein values of parameters for the parameterized block are stored in memory, and used to set the values of the parameters.

27. A reconfigurable architecture according to claim 1, wherein the decoder further includes an input for receiving values of parameter settings, and at least one parameterized block, wherein values of parameters for the parameterized block are received at the input and used to set the values of the parameters.

28. A reconfigurable architecture according to claim 1, further including memory, wherein control signals are used to reconfigure the network, the control signals being stored in the memory.

29. A reconfigurable architecture according to claim 1, further including memory for storing data representative of a set of configuration signals representing all of the possible configurable networks of ACS blocks, BMU generators and trace-back mechanisms for both recursive and non-recursive systematic forms, and configurable connections between the ACS blocks, BMU generators and trace-back mechanisms, wherein (a) the reconfigurable network and (b) reconfigurable connections are arranged so as to be responsive to the configuration signals.

30. A reconfigurable architecture according to claim 29, wherein the data representative of the set of configuration signals includes information relating to parameters and algorithms used to decode vectors received by the reconfigurable architecture.

31. A reconfigurable architecture according to claim 29, further including an analyzer configured so as to determine the systematic trellis codes used to encode the vectors received by the reconfigurable architecture, wherein the reconfigurable network and reconfigurable connections are configured as a function of the determination of such systematic trellis codes.

32. A reconfigurable architecture for use in decoding vectors received by the reconfigurable architecture in accordance with one or more recursive and/or non-recursive systematic trellis codes that can vary in size and constraint K, as well as generator polynomial, the reconfigurable architecture comprising:

a decoder including (a) a reconfigurable network blocks, and (b) reconfigurable connections between the blocks, arranged so that the precise number of network components can be adaptively rearranged by splitting and merging the components in time and space, and interconnected in a network so as to decode the vectors in accordance with any one of a plurality of decoding algorithms.

33. A reconfigurable architecture for use in decoding vectors received by the reconfigurable architecture in accordance with one or more recursive and/or non-recursive systematic trellis codes that can vary in size and constraint K, as well as generator polynomial, the reconfigurable architecture comprising:

a decoder including (a) a reconfigurable network blocks, and (b) reconfigurable connections between the blocks, arranged so that the precise number of network components can be adaptively rearranged by splitting and merging the components in time and space, and interconnected in a network so as to simultaneously decode the vectors in accordance with one or more decoding algorithms, as well as one or more of the following functions: (1) equalizing and (2) filtering.

34. A reconfigurable architecture according to claim 33, wherein the equalizing and filtering functions include a variety of MLSE/RSSD/RSSE/PSP processing.

35. A reconfigurable architecture according to claim 33, wherein the equaling and filtering functions include PSP equalization/filtering decoding including MIMO and space time decoding based upon convolution/trellis, block or turbo codes.

36. A reconfigurable architecture according to claim 33, wherein the equalizing and filtering functions include processing using Viterbi algorithms.

37. A reconfigurable architecture for use in simultaneously decoding one or more vectors received by a core in accordance with a plurality of recursive and/or non-recursive systematic trellis codes of varying sizes and constraints K, as well as generator polynomials, the architecture comprising:

a decoder including (a) a reconfigurable network of ACS blocks, BMU generators and trace-back mechanisms for both recursive and non-recursive systematic forms, and (b) reconfigurable connections between the ACS blocks, BMU generators and trace-back mechanisms, arranged so that the precise number of network components can be adaptively rearranged by splitting and merging the components in time and space, and interconnected in a network as a function of size and the constraint K and generator polynomial of each code used for encoding the vectors received by the architecture.

38. An integrated chip comprising a reconfigurable architecture for use in decoding one or more vectors received by a core in accordance with any one of a plurality of recursive and/or non-recursive systematic trellis codes of varying sizes and constraints K, as well as generator polynomials, the chip comprising:

a decoder including (a) a reconfigurable network of ACS blocks, BMU generators and trace-back mechanisms for both recursive and non-recursive systematic forms, and (b) reconfigurable connections between the ACS blocks, BMU generators and trace-back mechanisms, arranged so that the precise number of network components can be adaptively rearranged by splitting and merging the network components in time and space, and interconnected in a network as a function of size and the constraint K and generator polynomial of each code used for encoding the vectors received by the chip.

39. A communications system including the integrated chip of claim 38.

40. A method of decoding vectors encoded in accordance with any one of a plurality of recursive and/or non-recursive systematic trellis codes of varying sizes and constraints K, as well as generator polynomials, the method comprising:

reconfiguring (a) a network of ACS blocks, BMU generators and trace-back mechanisms for both recursive and non-recursive systematic forms, and (b) connections between the ACS blocks, BMU generators and trace-back mechanisms, so that the precise number of network components can be adaptively rearranged by splitting and merging the components in time and space, and interconnected in a network as a function of size and the constraint K and generator polynomial of each code used for encoding the vectors received by the network.

* * * * *